Aug. 30, 1960 C. J. BUSANOVICH 2,951,105

THERMOELECTRIC COMPOSITIONS AND ELEMENTS
AND DEVICES USING THEM
Filed Sept. 12, 1957

INVENTOR.
CHARLES J. BUSANOVICH
BY J. L. Whittaker

ATTORNEY

United States Patent Office 2,951,105

Patented Aug. 30, 1960

2,951,105

THERMOELECTRIC COMPOSITIONS AND ELEMENTS AND DEVICES USING THEM

Charles J. Busanovich, Princeton, N.J., assignor to Radio Corporation of America, a corporation of Delaware Filed Sept. 12, 1957, Ser. No. 683,534

4 Claims. (Cl. 136—5)

This invention relates to improved thermoelectric devices. More particularly, this invention relates to improved compositions of elements useful in thermoelectric devices comprising one or more junctions between elements of different compositions.

When two wires of dissimilar thermoelectric compositions have their ends joined so as to form a continuous loop, a pair of junctions is established between the respective ends so joined. If the two junctions are at different temperatures, an electromotive force will be set up in the circuit thus formed. This effect is called the thermoelectric or Seebeck effect and the device is called a thermocouple. This effect is useful in many practical applications. For example, if one junction is maintained at a constant temperature, the electromotive force may be read as a function of the temperature of the other junction which then acts as the sensing element of a thermocouple thermometer. Heat energy from either the sun or nuclear fission may be transformed directly to electrical energy using the Seebeck effect providing a means for making thermal batteries or generators. If an electromotive force is applied to the circuit described above, heat will be generated at one junction and absorbed at the other. This has been termed the Peltier effect and its usefulness in environmental heating and cooling is apparent.

Thermoelectric materials may be classified as either N-type or P-type depending on the direction of current flow across the cold junction formed by the thermoelectric material and another element when operating as a thermoelectric generator according to the Seebeck effect. If the positive current direction at the cold junction is from the thermoelectric material, then it is termed a P-type thermoelectric material. Conversely, if the positive current direction is from the cold junction and toward the thermoelectric material, it is termed an N-type thermoelectric material. When the thermoelectric material and another element form a cold junction occording to the Peltier effect, the current directions will be opposite those just described. The present invention relates to improved N-type thermoelectric materials.

There are three fundamental requirements for desirable thermoelectric materials. The first requirement is a high electromotive force per degree difference in temperature between junctions. This is referred to as the thermal power of the material. The second necessity is a low heat conductivity since it would be difficult to maintain either high or low temperatures at a junction if the material conducted heat too readily. The third requisite for a good thermoelectric material is high electrical conductivity or, conversely, low electrical resistivity. This is apparent since the temperature difference between junctions will not be great if the current passing through the circuit generates excessive Joulean heat.

An approximation of the quality of a thermoelectric material may be made by relating these three factors and by taking F as an approximate factor of merit, expressing it as $$F=\frac{e}{\sqrt{K\rho}}$$

where $e$=thermal E.M.F. of a thermoelectric material in respect to copper or lead, K=thermal conductivity, and $\rho$=electrical resistivity. In taking into account the effects of impurities in a thermoelectric composition, the factor of merit may be expressed as $$F'=\frac{e}{\sqrt{\rho}}$$

since, as a rule, impurities have a very slight effect on K but can change $\rho$ considerably.

In addition, a thermoelectric composition is enhanced in its usefulness if it is readily prepared and easily worked. Although some materials of the prior art have a relatively high factor of merit, F′, it has been found that they are relatively weak physically, being friable and fragile much as blackboard chalk crayons. Further, many of these materials comprise relatively complicated phase systems and are therefore difficult to crystallize in uniform ingots when they are cooled from their melting temperatures.

One object of the instant invention is to provide improved thermoelectric materials and elements having high factors of merit (F′) while possessing greater strength than has heretofore been achieved.

Another object of this invention is to provide improved thermoelectric materials and elements which have high factors of merit, and which are relatively simple to prepare.

Still another object of this invention is to provide improved thermoelectric materials and elements which have high factors of merit and which are easily worked.

A feature of this invention comprises a thermoelectric composition consisting essentially of $Bi_2Te_3$ and, on the basis of the total weight of said $Bi_2Te_3$, including in addition:

| | Percent |
|---|---|
| Bismuth | 0.10 to 0.50 |
| Antimony | 0.27 to 0.80 |
| Copper | 0.13 to 0.40 |

The compositions within this invention result in improved thermoelectric materials and members with high factors of merit, and have desired ease of preparation, strength and workability.

Another feature of this invention comprises a device utilizing a novel thermoelectric composition within this invention in conjunction with a complementary thermoelectric composition. Such a device may be a thermal generator, a thermocouple thermometer, an environmental heat or cooling apparatus or the like.

The invention will be described in greater detail with reference to the accompanying drawings in which like reference characters are applied to similar elements in the different figures.

Figure 1:
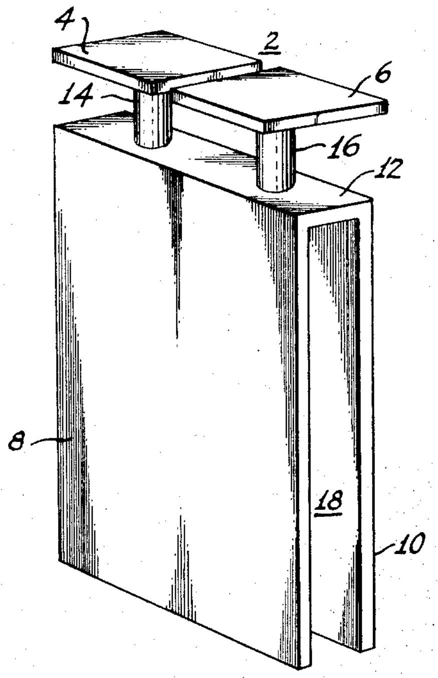
Fig. 1 is a perspective view illustrating one embodiment of a thermoelectric device utilizing a composition according to this invention.

Referring to Fig. 1, there is shown an individual thermocouple element 2 which utilizes a novel composition in accordance with this invention and which makes use of the Peltier effect to cool an environment such as a room or a food storage space.

Figure 2:
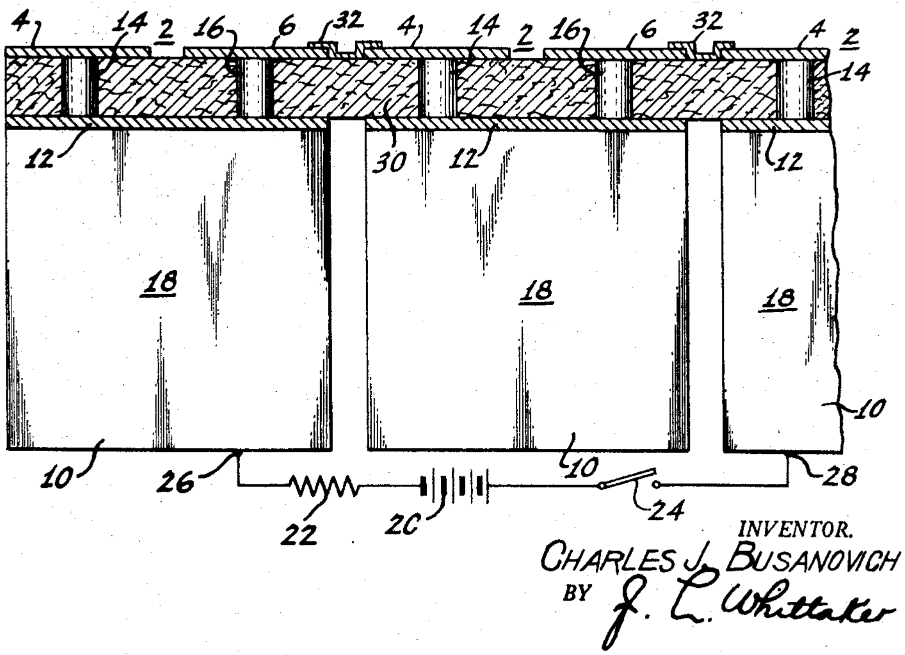
Fig. 2 is a sectional view of a system utilizing a plurality of devices of the type illustrated in Fig. 1.

Thermocouple element 2 comprises two coplanar plates 4 and 6 which are composed of electrically and thermally conductive material, copper for example. Cylindrical bodies of complementary thermoelectric materials 14 and 16 are fastened to plates 4 and 6, respectively, as by brazing, and are similarly anchored to a channel member 18 on web portion 12 thereof so that the longitudinal axes of the cylindrical bodies 14 and 16 are perpendicular to the plane of the plates 4 and 6 as well as the plane of the web portion 12. Channel member 18 may be formed from extruded aluminum or another metal having good thermal and electrical conductivity. In this embodiment, plates 4 and 6 will each make up a part of a cold junction when the system shown in Fig. 2 is energized. Therefore, channel member 18 functions as a heat exchange terminal, dissipating heat by means of substantially parallel flange portions 8 and 10 extending from the web portion 12, perpendicular to the plane of web portion 12. Web portion 12 is narrow and rectangular in shape and the flange portions 8 and 10 are relatively long, wide and thin, thereby providing a large heat exchange surface.

In this embodiment, cylindrical body 14 is an N-type composition in accordance with the invention. A preferred composition consists essentially of $Bi_2Te_3$ and, on the basis of the total weight of the $Bi_2Te_3$, including in addition, 0.34% bismuth, 0.55% antimony and 0.28% copper. Body 16 is a complementary or P-type thermoelectric composition comprising 60 mol percent tellurium, 20 mol percent bismuth, 20 mol percent antimony, and, based on the total weight of the tellurium, bismuth and antimony, 0.28% silver and 0.56% selenium, although it should be understood that any P-type thermoelectric material will satisfy the conditions of proper operation.

Referring especially to the sectional view in Fig. 2, a plurality of elements 2, one of which is shown in Fig. 1, is connected in series by bridging strips 32 of conducting material such as copper and also by an energizing circuit so as to form a cooling system. The elements 2 included in the plurality are mounted on a board 30 comprising a thermal insulating material such as cork or a rigid foam plastic. A portion of the electrical circuit between any two such elements 2 comprises one channel member 18, the N-type cylindrical body 14 thereon, the plate 4 attached to cylindrical body 14, the bridging strip 32 contacting plate 4, the plate 6 in contact with bridging strip 32, the P-type cylindrical body 16 attached to this plate 6 and the channel member 18 to which the P-type cylindrical body 16 is secured. The energizing circuit comprises in series, a direct current source 20, a resistor 22 and a control switch 24, connected to the channel members 18 of the endmost elements 2 in the system at terminals 26 and 28.

When switch 24 is closed, therefore, a current is caused to flow through each element 2. In accordance with the Peltier effect described above, a decrease in temperature (heat absorption) will appear at every junction comprising plates 6 and 4 and bridging strip 32 if the polarity of the current source 20 is oriented so that the positive current flows into those junctions from an N-type cylindrical body 14. The heat dissipating junctions in this embodiment comprise the channel members 18 which, along with the energizing circuit, connect the ends of the P-type and N-type elements 14 and 16. The heat insulating board 30, for example, may be set into the wall of a house so that the operation of the system utilizing the invention will cool the rooms. With the channel side outdoors, thermal energy will be pumped from the house and dissipated by the channel members 18 which will be maintained at a constant temperature by the outside ambient. It should be understood that the direction of heat transfer may be reversed by reversing the polarity of the current source 20 so that a reversal in the potential between the N-type and P-type cylindrical bodies 14 and 16 is effected.

The preferred N-type thermoelectric composition according to the invention has a negative thermal E.M.F. ($e$) with respect to copper or lead of 160 to 180 microvolts/° C. and a resistivity ($\rho$) as low as .0006 to .0008 ohm-cm.

The preferred composition within the scope of this invention was prepared by melting the following constituents:

| | | Percent based on total weight of bismuth and tellurium |
|---|---|---|
| Bismuth | 18.72 g. | |
| Tellurium | 17.00 g. | |
| Antimony | 0.20 g. | 0.55 |
| Copper | 0.10 g. | 0.28 |

The amount of bismuth includes about 0.34% in excess of the stoichiometric amount. The material may be prepared by melting the above mixture in a vacuum or an inert atmosphere and then allowing to cool. To insure adequate mixing, the material may be heated to about 700° C. (about 200° C. above the melting point) and rocked in a rocking furnace for 5 to 10 minutes at this temperature before allowing to cool.

It should be further understood that compositions and members within the scope of this invention may vary with respect to the proportions of constituents but they consist essentially of $Bi_2Te_3$ and, on the basis of the total weight of said $Bi_2Te_3$, include in addition:

| | Percent |
|---|---|
| Bismuth | 0.10 to 0.50 |
| Antimony | 0.27 to 0.80 |
| Copper | 0.13 to 0.40 |

There have thus been described novel and improved thermoelectric compositions and members which are easily prepared and which have a high factor of merit (F′) and desired strength and workability. Although a particular embodiment of this invention utilizing the Peltier effect has been described herein, devices within this invention may take the form of thermal generators, thermocouple thermometers and the like.

What is claimed is:

1. A thermoelectric composition consisting essentially of $Bi_2Te_3$ and, on the basis of the total weight of said $Bi_2Te_3$, including in addition:

| | Percent |
|---|---|
| Bismuth | 0.10 to 0.50 |
| Antimony | 0.27 to 0.80 |
| Copper | 0.13 to 0.40 |

2. A thermoelectric composition consisting essentially of $Bi_2Te_3$ and, on the basis of the total weight of said $Bi_2Te_3$, including in addition:

| | Percent |
|---|---|
| Bismuth | 0.34 |
| Antimony | 0.55 |
| Copper | 0.28 |

3. A member for use in a thermoelectric device, said member comprising a body made of a composition consisting essentially of $Bi_2Te_3$ and, on the basis of the total weight of said $Bi_2Te_3$, including in addition:

| | Percent |
|---|---|
| Bismuth | 0.10 to 0.50 |
| Antimony | 0.27 to 0.80 |
| Copper | 0.13 to 0.40 |

4. A member for use in a thermoelectric device, said member comprising a body made of a composition consisting essentially of $Bi_2Te_3$ and, on the basis of the total weight of said $Bi_2Te_3$, including in addition:

| | Percent |
|---|---|
| Bismuth | 0.34 |
| Antimony | 0.55 |
| Copper | 0.28 |

References Cited in the file of this patent

UNITED STATES PATENTS 2,762,857 Lindenblad ---------- Sept. 11, 1956